United States Patent [19]

Camp, Jr.

[11] 3,754,194

[45] Aug. 21, 1973

[54] FREQUENCY STABILIZATION FOR LSA OSCILLATOR

[75] Inventor: William O. Camp, Jr., Dryden, N.Y.

[73] Assignee: Cayuga Associates, Inc., Ithaca, N.Y.

[22] Filed: Apr. 3, 1972

[21] Appl. No.: 240,567

[52] U.S. Cl. ............... 331/1 R, 331/17, 331/107 G, 331/175

[51] Int. Cl. ............... H03b 3/04

[58] Field of Search ............... 331/1 R, 9, 17, 96, 331/107 G, 175, 176

[56] References Cited

UNITED STATES PATENTS 3,529,259 9/1970 Holmes et al. ............... 331/9

OTHER PUBLICATIONS

Electronic Design, Vol. 6, March 15, 1971, p. 54.

Stickler, "Injection–Locking of Gunn Oscillators with Feedback Stabilization," proceedings of the IEEE, October 1969, pp. 1772, 1773.

Tsai et al., IEEE Transactions on Microwave Theory and Techniques, Vol. MTT–18, No. 11, November 1970, pp. 883, 884.

*Primary Examiner*—Roy Lake
*Assistant Examiner*—Siegfried H. Grimm
*Attorney*—N. Jerome Rudy

[57] ABSTRACT

To compensate for changes in the output frequency of an LSA mode oscillator, the bias voltage pulse applied to the oscillator is varied by means of a feedback circuit. The output of a high or low pass filter receiving the oscillator RF output is retified to trigger a monostable multivibrator. In an advantageous technique, the pulse output of the multivibrator is integrated, amplified and applied to a Zener diode which is connected to the bias voltage input of the oscillator to provide a clipping voltage to the oscillator responsive to changes in the RF output. A constant voltage is applied to the integrator along with the monostable output to prevent low repetition rates of the multivibrator from introducing a significant AC component in the integrator output. Different rates of convergence are provided in the feedback loop by employing a monostable multivibrator whose output pulse width is controlled by an RF discriminator circuit. To determine more precisely the frequency at which the multivibrator is triggered, a differential amplifier system is added to compare the power in the filter output with the power in the unfiltered RF output.

21 Claims, 10 Drawing Figures

FREQUENCY STABILIZATION FOR LSA OSCILLATOR

BACKGROUND OF THE INVENTION

The invention relates generally to the field of semiconductor devices which exhibit bulk negative resistivity at bias voltages above the Gunn effect threshold and operate in the LSA (i.e., which means and stands for limited space charge accumulation) mode to produce a pulsed microwave output. More specifically, the invention relates to the problem of frequency instability in LSA mode oscillators.

LSA mode diode oscillators are currently being investigated as a new, relatively inexpensive miniature source of high power microwave signals, especially useful in the fields of communications and radar. Following the discovery by Dr. John B. Gunn of transit-time current oscillations in thin multi-layer wafers of n-type gallium arsenide crystals, it was found (Copeland, Proc. IEEE (Letters), vol. 54, p. 1979, 1966) that truly bulk (LSA) oscillations could be induced in gallium arsenide crystals under certain conditions. The LSA mode of operation of microwave diodes is characterized by the fact that an intermittent electric field is applied between opposite faces of the diode material. The field is established by bias voltage pulses exceeding the Gunn threshold in amplitude and having a predetermined duty cycle. The resulting microwave RF output of the LSA diode is in pulse form, rather than continuous wave as in Gunn effect devices.

One of the problems of LSA mode oscillators is the extreme sensitivity of the output frequency to variations in applied voltage and ambient temperature. Within the LSA operating range, the output frequency increases both with increasing voltage and with increasing temperature, and decreases similarly with decreasing voltage and temperature.

SUMMARY OF THE INVENTION

Accordingly, the general purpose of the invention is to stabilize the output frequency of LSA mode oscillators and similar devices. Another object of the invention is to control the applied bias voltage to compensate for variations in the output frequency of the oscillator. Still another object of the invention is to provide a means to both select and control the output frequency of the oscillator.

The applicant has discovered that these and other objects may advantageously be accomplished by employing a feedback loop to vary the voltage of the applied bias voltage pulses in response to the output frequency of the LSA mode oscillator. The output of the diode may be applied to a high or low pass filter whose output is rectified to trigger a monostable multivibrator. The monostable output, which is a negative going pulse if a high pass filter is used, or a positive going pulse if a low pass filter is used, is received by a continuously discharging integrator.

In one desirable embodiment of the invention, the integrator output may be amplified and applied to a Zener diode connected to the bias voltage input of the oscillator to clip the bias voltage in response to the output frequency. For example, in accordance with such an embodiment, if a high pass filter is used and the RF output is below the filter cut-off frequency, the monostable output will be zero and the decreasing output of the integrator will allow the bias voltage to rise, thus increasing the output frequency. When the output frequency is above cut-off, the monostable output is triggered, causing the integrator output to rise, thus lowering the voltage applied to the LSA oscillator.

However, in addition to the foregoing explanation of the indicated possible embodiment, it is to be understood that practice of the present invention is also independent of the polarity of the monostable pulse employed. Thus, in any case, where the bias voltage is varied by charging the voltage below a Zener diode which in turn clips a modulator pulse, the foregoing mode of operation applies as a good method for variation of the bias voltage. Nonetheless, it is oftentimes sufficient to merely vary the voltage input to the modulator operating without any clipping. Thus, in general, it is only necessary to vary the bias voltage to achieve the desired effect in any given situation; it being understood in this connection that the bias voltage(s) required by the oscillator can also be negative.

In another advantageous embodiment of the invention, the power delivered by the oscillator itself is used as a reference for the trigger voltage applied to the monostable multivibrator to determine whether the oscillator output is in the pass band of the filter. This is accomplished by adding a differential system to the feedback loop in which the power of the filter output is compared with the power in the unfiltered output of the oscillator to provide a control signal to the multivibrator which inhibits or blocks the trigger input if the power from the filter is insufficient. The need for this is to eliminate the sensitivity of the circuit described in the preceeding paragraph to variations in power output of the oscillator. The latter most definitely occurs as temperature variations are experienced.

In one embodiment, the integrator receives a bias voltage equal to one half of the average voltage which would appear at the integrator input if the monostable output occurred during every repetition of the bias voltage applied to the diode. By this arrangement, the multivibrator is prevented from operating in a low repetition mode which would cause a significant AC component in the integrator output.

The same effect may also be produced in the following manner: With a bias of zero volts, the low frequency causes the monostable pulse to be pulsed in the same way while high frequency causes a monostable of opposite polarity to be pulsed. In this instance, there is no discharging resistor across the capacitor as the second monostable accomplishes the same function.

In another embodiment, a monostable multivibrator with selectable pulse widths is employed to provide varying rates of convergence depending on the closeness of the output frequency to the cut-off frequency of the afore-mentioned filter.

DESCRIPTION OF THE PREFERRED EMBODIMENT

Figure 1:
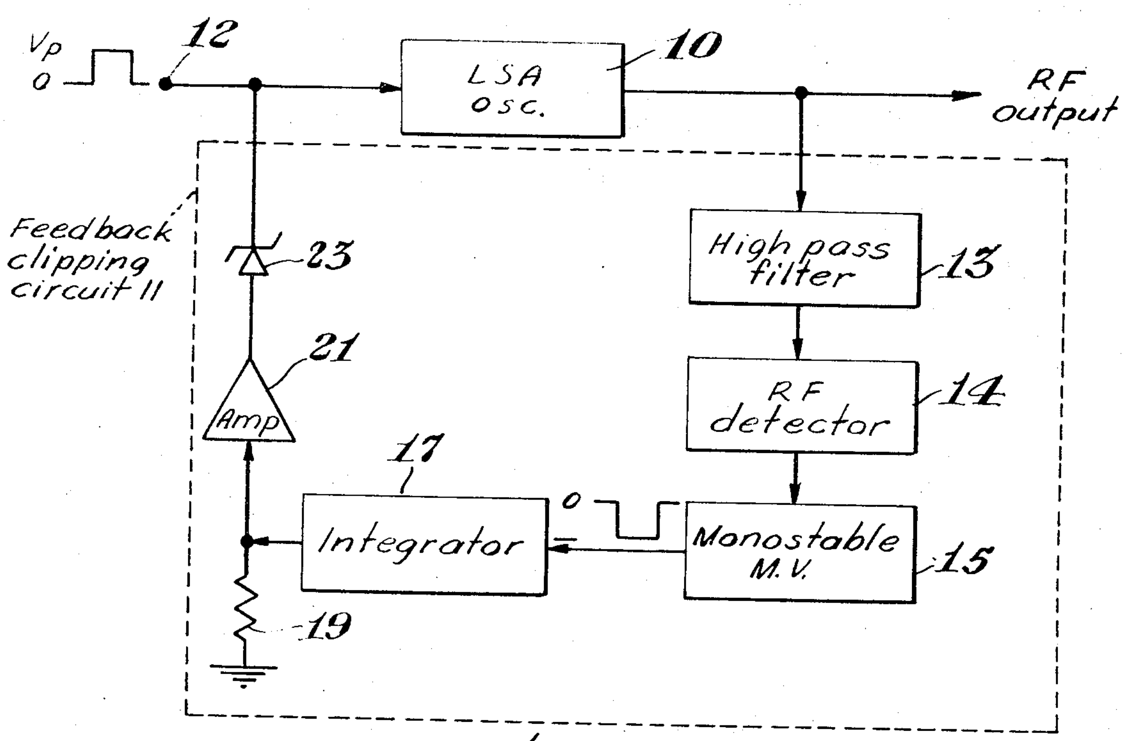
FIG. 1 is a block and schematic representation of a frequency stabilizing system for an LSA mode oscillator employing a feedback loop with a high pass filter.

An LSA mode semi-conductor oscillator 10 is shown in FIG. 1 with an output-responsive feedback clipping circuit 11 according to the invention. In the absence of the feedback circuit 11, the LSA oscillator 10 would be driven in its customary manner to produce a pulsed microwave output in response to the bias pulses from a modulator (not shown), having a pulse height, $v_p$, applied at an input terminal 12. The feedback circuit 11 is added to correct variations in the microwave RF output of the oscillator 10 due to variations in the RF load, the temperature or the voltage applied at the terminal 12.

The clipping aspect of circuit 11 is an example of a method which may be utilized to vary the bias voltage to the oscillator, the frequency of which varies proportionally. The clipping part of circuit 11 can also serve the purpose of removing variations in the bias pulse from the modulator (if such are present) which would cause frequency variations in a single pulse.

In FIG. 1, the feedback circuit 11 employs a high pass filter 13 receiving a portion of the oscillator output as a sample. The cut-off frequency of the filter 13 coincides with the desired RF output frequency. The output of filter 13 is passed to an RF detector 14 which rectifies the filter output to provide a DC trigger voltage to a monostable multivibrator 15. The output of the multivibrator 15 in FIG. 1 is normally zero and goes negative for a predetermined time (pulse width) when triggered by the detector 14. The multivibrator 15 should produce a constant width high duty cycle pulse output. It has been found that the operation of the circuit is enhanced if the monostable pulse width is a large fraction of the repetition period (reciprocal of the repetition rate or frequency) of the bias voltage applied at the terminal 12. The monostable output is passed to an integrator 17 having a time constant much greater than the period of the bias input pulses at the terminal 12.

The output of the integrator 17 is continuously discharged or reduced by a grounded shunt resistor 19. The value of the resistor 19 should be selected so that the discharge time of the integrator is also on the order of 50 times the period of the bias pulse input.

The integrator output is next passed to a DC amplifier 21 which magnifies the integrator output. The output of the amplifier 21 is coupled across, or in parallel to, the bias input pulse at the terminal 12 by means of a Zener diode 23. The diode 23 is reverse-biased so that it conducts in the reverse direction at the Zener or breakdown voltage, $v_z$. The output of the amplifier 21 serves as a variable negative voltage source. Connecting this negative voltage source with the Zener diode 23 across the input to the LSA oscillator 10 provides a clipping function for the bias voltage pulses applied at the terminal 12. If the Zener diode 23 were coupled alone across the input, the bias voltage pulse applied to the oscillator 10 would have an amplitude of $v_z$, regardless of the height of the input pulse due to the constant voltage properties of the Zener diode. By connecting the DC output of the amplifier 21 in series with the Zener diode 23, the voltage applied to the oscillator 10 is reduced from the value $v_z$ by the voltage level of the amplifier output, due to the fact that series voltage sources add algebraically. That is, the voltage pulse applied to the oscillator 10 can be represented as i $v_z - v_d$, where $v_d$ is the voltage output of the amplifier 21. The clipping voltage, $v_z - v_d$, is less than the voltage, $v_p$, of the bias input pulse at the terminal 12.

Figure 3:
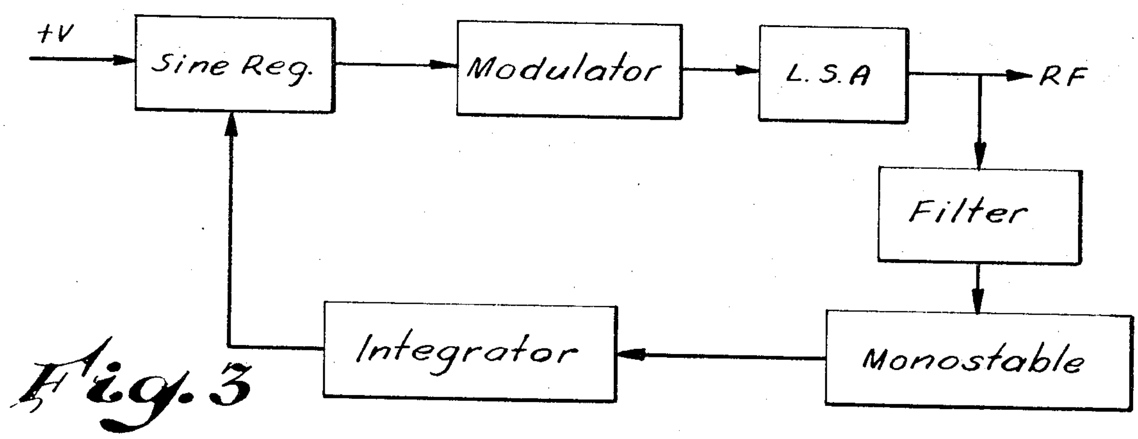
FIG. 3 illustrates in block and schematic diagram form a more generalized possibility of embodiment according to the invention.

Again, it should be noted that a generalized embodiment may be employed as is described in the foregoing and schematically illustrated in the self-explanatory FIG. 3. Thus, the bias voltage can be generally varied in literally any desired manner or technique of electronic contrivance.

To facilitate an understanding of the significance of the modifications described below, the operation of the basic circuit of FIG. 1 will be described at this point.

The Zener voltage $v_z$ is chosen such that the RF output frequency is greater than the cut-off frequency of the high pass filter 13 for all conditions of temperature, load and environment. Because of this condition, at the outset of operation of the oscillator 10, the detector 14 will receive an RF pulse from the filter 13 every time the LSA oscillator 10 is pulsed. The DC output of the detector 14 triggers the monostable multivibrator 15 causing the integrator output to rise. The amplifier 21 inverts the rising integrator output and therefore subtracts this voltage from the Zener voltage to reduce the voltage applied to the oscillator 10. Since the output of the oscillator 10 varies directly with voltage, the RF output frequency decreases. When the RF output is below the cut-off frequency of the filter 13, the multivibrator 15 will cease to be triggered, and the integrator output will be gradually dissipated by the resistor 19. The decreasing integrator output results in a smaller voltage being subtracted from the zener voltage. Accordingly, the voltage supplied to the oscillator 10 rises until the RF output is again above the cut-off of the filter 13, whereupon the operation of the feedback clipping circuit 11 is recycled. Besides stabilizing the frequency of the RF output, the feedback circuit 11 also provides a means of selecting the output frequency. By varying the cut off of the filter 13, the output frequency can be adjusted to a new level.

Figure 2:
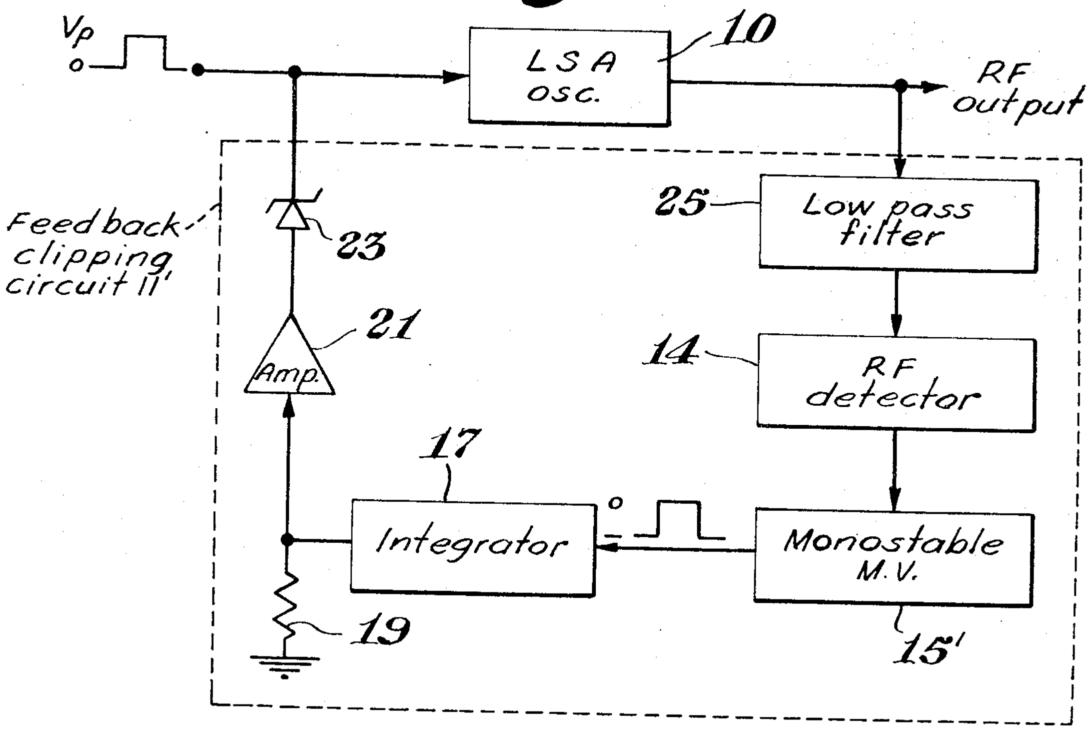
FIG. 2 is a block and schematic diagram illustrating the alternative use of a low pass filter in the feedback loop of the system of FIG. 1.

In the embodiment of FIG. 2, the feedback clipping circuit 11' is designed to operate conversely with respect to the circuit of FIG. 1. A low pass filter 25 replaces the high pass filter of FIG. 1. The multivibrator 15′ is implemented such that its non-triggered output is normally resting at a minus voltage and when triggered, rises for a predetermined time to zero voltage.

The other elements of the circuit of FIG. 2 are similar to those of FIG. 1. However, the operation differs in that the monostable multivibrator 15′ is triggered when the RF output falls below the cut-off of the filter 25. The monostable output (zero voltage pulse) causes the integrator output to decrease by virtue of the resistor 19. Consequently, the output of the amplifier 21 becomes a smaller negative value which causes the difference between the Zener voltage $v_z$ and the amplifier voltage $v_d$ to increase driving the RF output of the oscillator 10 higher. When the output frequency is above the cut-off of the filter 25, the multivibrator 15′ is off and its output is negative, causing the integrator output to rise, lowering the voltage applied to the oscillator 10 which in turn causes the RF output to decrease. The embodiment of FIG. 2 has the advantage of allowing the voltage supplied to the oscillator 10 at all times to be less than that which would cause oscillation to cease and possibly damage the diode.

The AC component of the monostable output superimposes a certain amount of noise on the desired average value of the integrator output. In FIG. 1, when a lower voltage is required across the integrator, a lower trigger rate of the monostable multivibrator 15 will result. However, the attenuation of the AC component in the monostable output is reduced at the lower repetition rate and therefore a large error is superimposed on the required DC integrator output value.

Figures 4, 4A, 5:
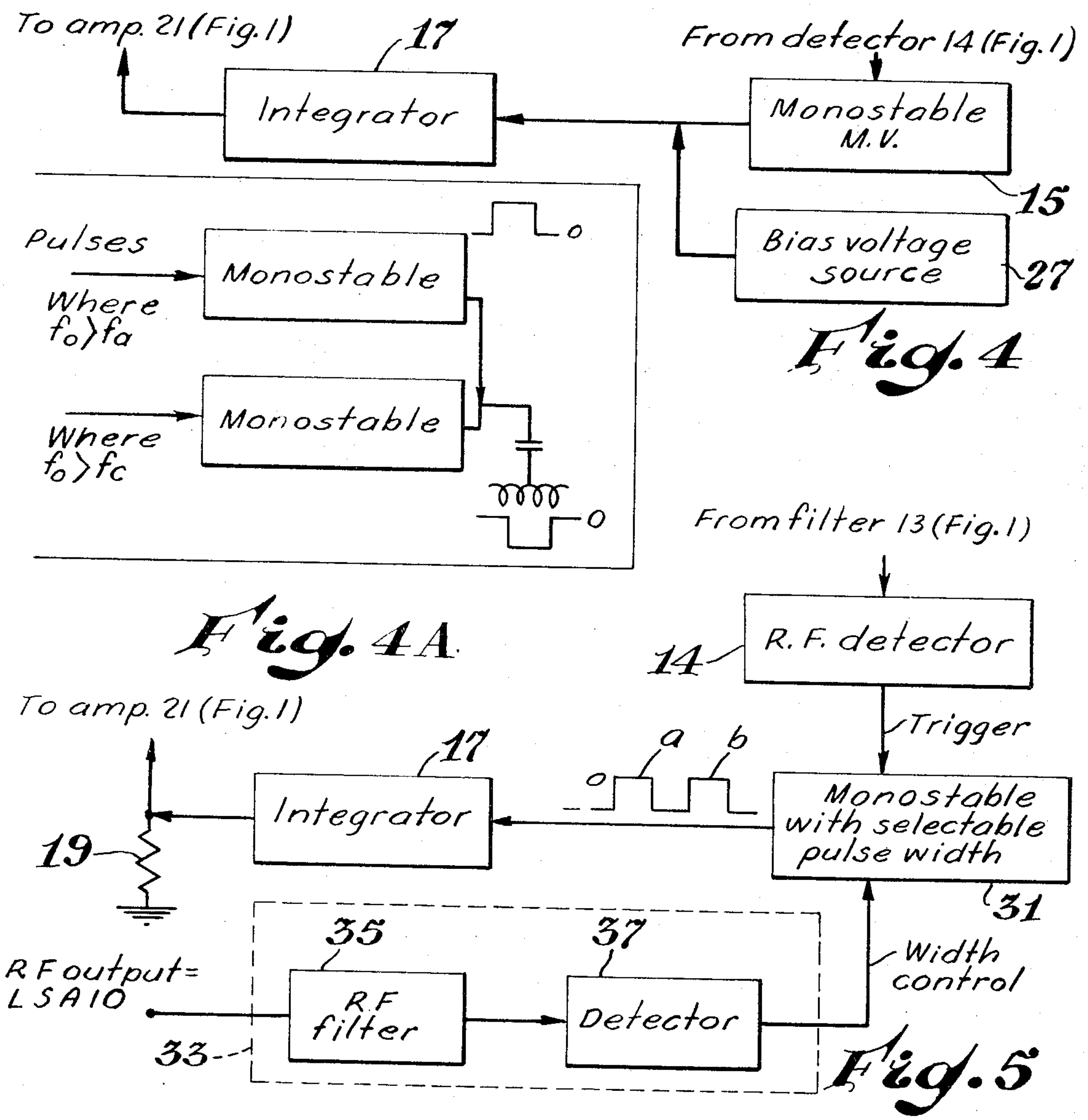
FIG. 4 is a block and schematic diagram (accompanied by FIG. 4A of the same sort to demonstrate the directly relevant electrical characteristics of the circuit) illustrating the application of a bias voltage to the integrator to reduce the AC component in the integrator output.
FIG. 5 is a block and schematic diagram representing another embodiment in which the monostable multivibrator has selectable pulse widths for driving the integrator of FIG. 1 at different rates to produce different corrective increments in the bias voltage applied to the diode.

One solution to this problem is to increase the time constant of the integrator adequately to filter the lowest possible repetition rate. A second solution is shown in FIG. 4 wherein a bias voltage source 27 is applied to the input of the integrator 17 at all times. The output of the voltage source 27 is chosen to provide a voltage equal in magnitude to one-half the average voltage which would appear at the integrator input if the monostable multivibrator 15 were triggered during every repetition period of the oscillator bias voltage applied at the terminal 12. In connection with the embodiment of FIG. 1, where the monostable pulse falls from zero to a negative value, for example, −1 volt, the discharging resistor 19 would be eliminated and the integrator bias voltage source 27 would provide a constant −½ volt to the integrator input.

The modification of the embodiment of FIG. 2 in accordance with FIG. 4 follows in a similar manner. Accordingly, in the embodiment of FIG. 4, to maintain a given average integrator output, the multivibrator 15 would have to be triggered every other repetition period. To increase or decrease the integrator output, the monostable would have to remain on or off continuously until the average required to lock the frequency was reached, at which point the multivibrator 15 would fire every other pulse to maintain that average voltage; as is further evident from the illustrative representation of FIG. 4A. It should be noted that the technique illustrated in FIG. 4 is a generalized method of eliminating lower frequency components in other systems that use integrators driven by a triggered source.

And, as above explained, a still more generalized technique for the purpose is illustrated in FIG. 3.

A wide range of frequencies and oscillator control voltages are covered when the ambient temperature around the LSA oscillator 10 is varied over 100 Centigrade degrees or more. To maintain a constant frequency for 100°C temperature change, the bias voltage applied to the oscillator 10 would have to be changed about 20 percent. However, if the frequency is to be maintained within a tolerance of ± 3.0 megaHertz, for example, the largest oscillator bias voltage increments would have to be less than about 0.1 percent of the applied bias voltage. At a 0.1 percent increment, as many as 200 steps would be necessary to correct the oscillator bias voltage for a 100° temperature change. The term "step" refers to the change in the voltage applied to the oscillator 10 which is caused by one output pulse from the monostable multivibrator 15 (FIG. 1).

The number of steps required to correct for abrupt changes in temperature can be greatly reduced by using two different sizes of increments. For instance, assume that the RF output of the oscillator 10 is far below the cut-off frequency of the low pass filter 25 of FIG. 2. At this point, it would be desirable for the voltage applied to the oscillator to change by large increments. When the RF output approaches the cut-off of the filter, the step size should be reduced back to the size required for frequency maintenance within a certain tolerance, for example, 0.1 percent.

A functional embodiment of this selectable step system is shown in FIG. 5 as a modification to the low pass filter circuit 11′ of FIG. 2. Application to the circuit of FIG. 1 follows in a similar fashion. A monostable multivibrator 31 with selectable pulse widths replaces the multivibrator 15. The two choices of pulse widths are represented by pulses *a* and *b*, producing 0.1 percent and 2–5 percent increments in the voltage applied to the oscillator 10, respectively. The multivibrator 31 is triggered in the same manner as multivibrator 15′ of FIG. 2. However, an additional control input is provided by a discriminator circuit 33 to select the pulse width. In the discriminator circuit 33, a sample of the RF output of the oscillator 10 is received by the RF filter 35 whose cut-off frequency is, for example, 50 megaHertz below the cut-off of the filter 25 in FIG. 2. The output of the filter 35 is fed to a detector 37 which rectifies the filtered output and produces a pulse width control output to the monostable multivibrator 31.

In connection with the low pass feedback circuit 11′ of FIG. 2, if the filter 35 of FIG. 5 is a low pass filter, the width control output of the detector 37 should be arranged such that the larger pulse width b is selected when the filter has an RF output and the smaller pulse width a is selected when the filter 35 has no RF output. On the other hand, if a high pass filter is used for the filter 35 in connection with the circuit of FIG. 2, the control output of the detector 37 should be implemented in reverse fashion such that with no output from the filter 35, the large pulse *b* is selected.

Figure 6:
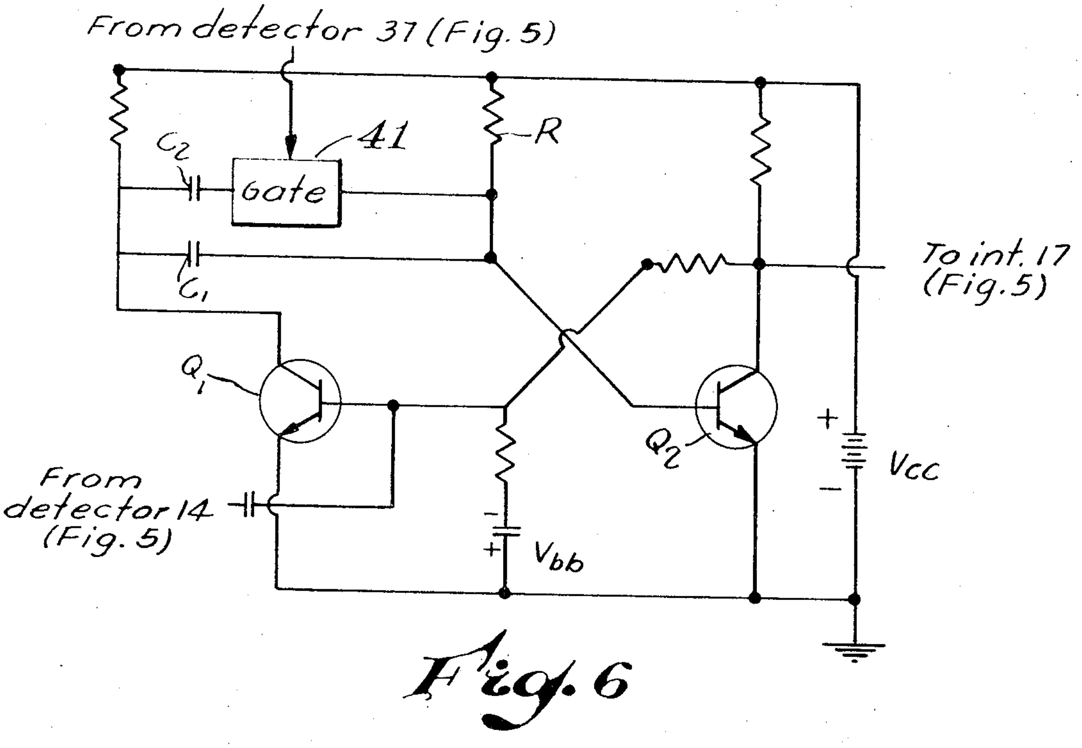
FIG. 6 is a schematic and block diagram illustrating multivibrator of FIG. 5 having two selectable pulse widths.

The embodiment of the monostable multivibrator 31 shown in FIG. 6 is an example of a standard monostable circuit having transistors $Q_1$ and $Q_2$. The monostable pulse width is determined normally by the discharging of a capacitor $C_1$ through a resistor R. The standard circuit is modified to include an additional capacitor $C_2$ connected in parallel with the standard capacitor $C_1$. Capacitor $C_2$ is in circuit with the capacitor $C_1$ only when a gate 41 is closed in response to the pulse width control signal from the detector 37 (FIG. 5).

Figure 7:
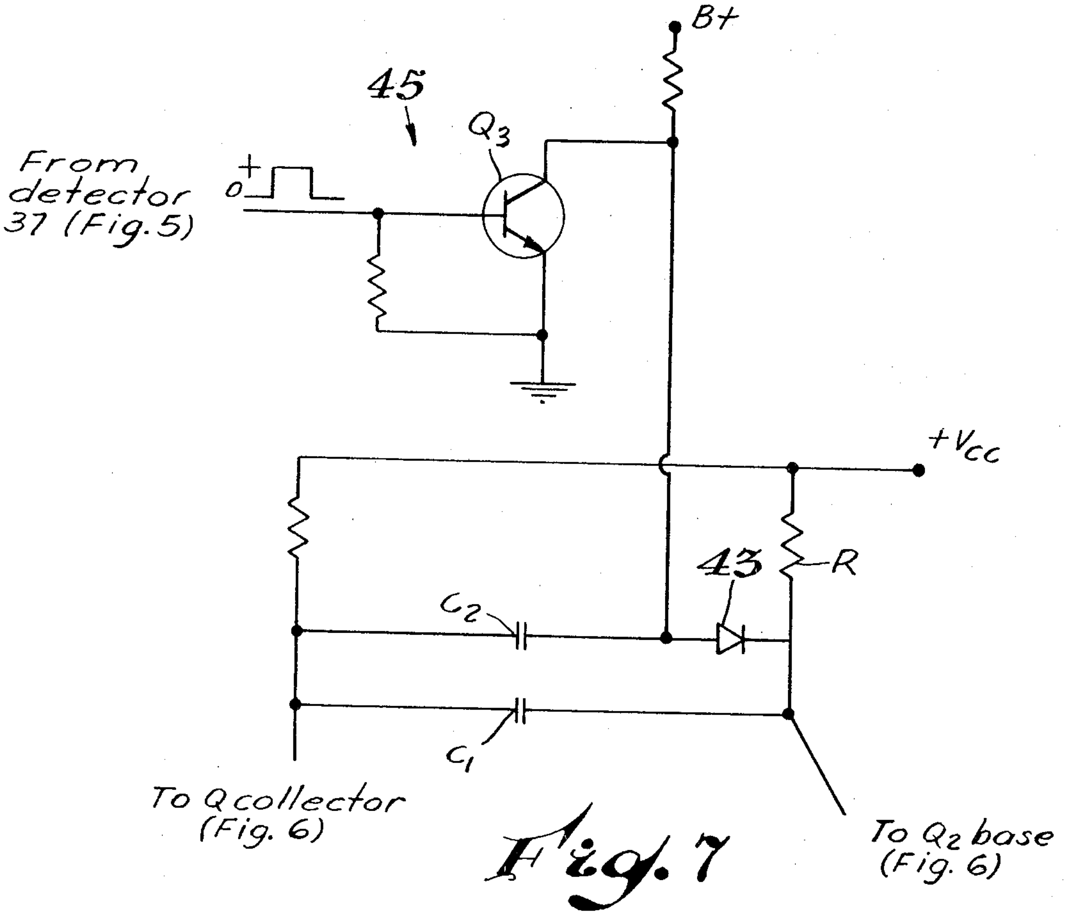
FIG. 7 represents an embodiment of the gated capacitor system of FIG. 6.

In FIG. 7, an illustrative example of an implementation of the gate 41 is shown. A normally forward-biased diode 43 is connected in series with the supplemental capacitor $C_2$. A diode bias switching circuit 45 includes a transistor $Q_3$ having a collector connected to a source of positive voltage, a grounded emitter, and a base connected through a resistance to ground so that the transistor $Q_3$ is normally biased OFF (non-conducting). The base of the transistor $Q_3$ is connected to receive a positive pulse output from the detector 37 of FIG. 5. The collector of transistor $Q_3$ is also connected to the junction of capacitor $C_2$ and the diode 43. Assuming the use of a high pass filter for the filter 35, in connection with the circuit of FIG. 2, when the RF output of the oscillator 10 is below both the cut-offs of filters 25 and 35, the detector 37 (FIG. 5) has no output; $Q_3$ is non-conducting and positive voltage is applied directly to the positive side of the diode 43.

Thus, both capacitor $C_1$ and $C_2$ are in use, and according to the laws of parallel capacitance, their respective capacitances add, producing a larger RC constant in the discharging circuit which results in a pulse of greater width, causing the RF output to rise rapidly to the cut-off of the filter 35. When the RF output of the oscillator 10 is between the cut-offs of the filters 35 and 25, the detector 37 produces a positive output which drives the base of the transistor $Q_3$ positive with respect to the emitter. Collector current flows, and the voltage at the collector falls, reverse-biasing the diode 43 and disconnecting the supplemental capacitor $C_2$ from the discharge circuit.

Thus, the RC circuit is dependent on the single capacitor $C_1$ and the pulse width is reduced. Those skilled in the art will recognize that the gate of FIG. 6 may take forms other than that in FIG. 7. For example, a gated diode like the silicon-controlled rectifier could be used or a field effect transistor circuit or the like. In addition, it is recognized that more than two pulse widths can be made available by adding additional gated capacitors to the RC circuit of the monostable multivibrator and including additional recognition circuitry similar to the discriminator 33 of FIG. 5, but having different cut-off frequencies. It is also recognized that instead of switching the capacitors, the resistors can be switched as they also determine the RC time constant.

Figure 8:
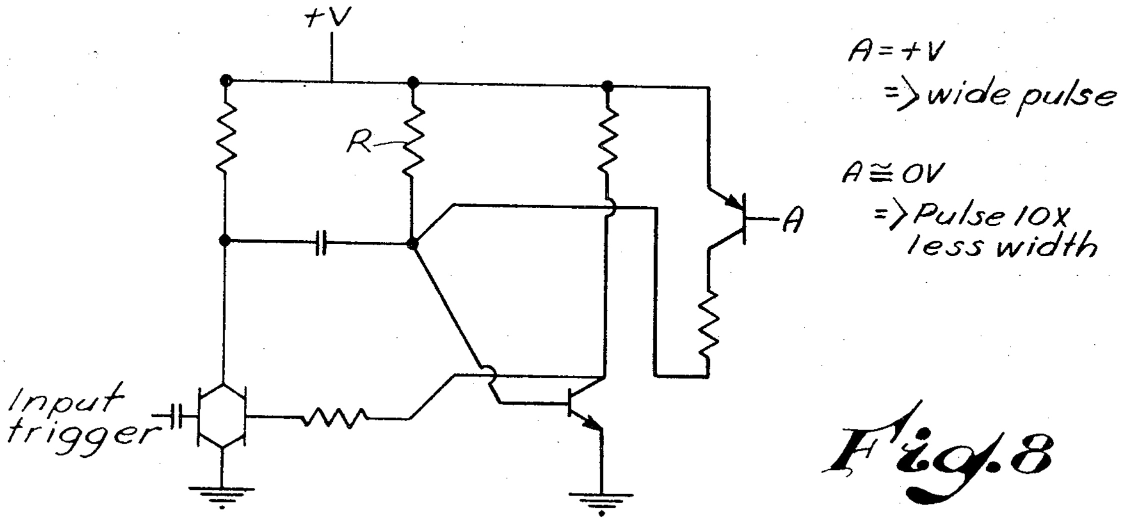
FIG. 8 shows another embodiment of the gated capacitor system of FIG. 6.

Thus, the self-explanatory illustration of and in FIG. 8 shows another possible and desirable variation of the technique.

As another alternative to the circuit of FIG. 1, the RF output of the oscillator 1 can be made to approach the high pass filter cut-off from below by using the output of the detector 14 to blank, instead of trigger, the monostable multivibrator 15.

A further alternative is to use a harmonic of the RF output as the control frequency, thus permitting the use of a smaller filter for the filter 13 (FIG. 1).

Figure 9:
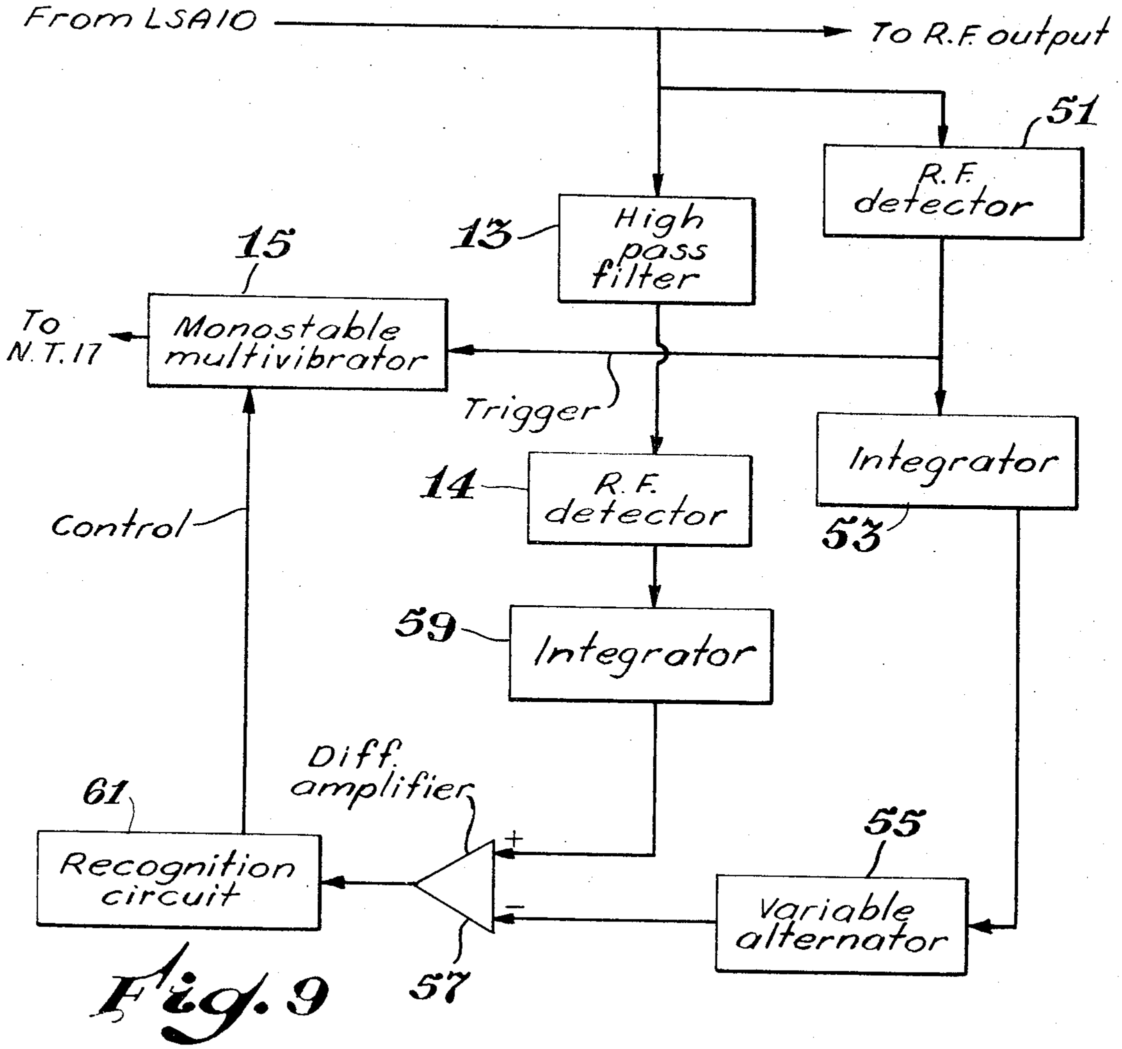
FIG. 9 is a block diagram illustrating another embodiment of the invention in which the total output power of the oscillator is compared to the filtered output (it being notable in connection with this illustration that a low pass filter will also work with complementary circuitry).

In FIG. 9, an alternate embodiment of the circuit of FIG. 1 is shown to illustrate a variation which eliminates any dependence of the feedback circuit 11 on the power level of the output of the oscillator 10. Some degree of power dependence will usually be exhibited by the circuit of FIG. 1 since the ordinary waveguide filter used for the high pass filter 13 will not have perfect cut-off characteristics. Instead, the filter attenuation curve has a measurable slope near the cut-off region. A signal received by the RF detector 14 as a result of a relatively low power RF output frequency just above the nominal filter cut-off frequency, may be at the same level as a signal received by the detector for a relatively high power RF output frequency just below the nominal cut-off. The varying input power therefore causes an ambiguity in determining whether the input frequency is actually above cut-off, i.e., in the pass band. To counteract this effect and cancel the system's dependence on the input power to the filter 13, a system is provided which determines when the output power of the filter 13, relative to in its input power, is sufficient to indicate that the RF output frequency is above the nominal cut-off frequency.

In FIG. 9, a portion of the unfiltered RF output is fed directly from the oscillator 10 to an RF detector 51 which provides a pulsed DC output indicative of the total power level in the RF output pulses. The output of the detector 51 forms the trigger input to the monostable multivibrator 15. A trigger pulse will occur during every repetition period of the RF output regardless of the RF frequency. An integrator 53 also receives the output of the detector 51 and passes the integrated output via a variable attenuator 55 to the inverting input of a conventional differential amplifier 57.

The output of the filter detector 14, which in FIG. 1 provides the monostable trigger, is instead passed to an integrator 59 whose output is connected to the non-inverting input of the differential amplifier 57. The purpose of the integrators 53 and 59 in the two input circuits to the amplifier 57 may be said to pass the video component of the rf pulse to amplifier 57.

The output of the amplifier 57 can thus be thought to represent the difference between the signals applied to its two inputs which is received by a recognition circuit 61 implemented to provide a control signal to the monostable multivibrator indicating that the output of the amplifier 57 is positive, or that it is above some other predetermined threshold value.

The difference output involved, more precisely, is such that it compares two pulses and then sends a pulse directly to the monostable vibrator. Thus, if the output from 51 is greater than that from 13, the difference output will pulse the monostable multivibrator. If, however, the output from 51 is less than that from 13, the difference output will not pulse the monostable multivibrator. The system works very well in practice; it being understood that the integrators then not too greatly perturb the pulse slopes.

The function of the control signal to the multivibrator 15 is to disable or block the regularly occurring trigger signal from the detector 51, in the event that the output of the amplifier 57 indicates that the difference between the filtered and unfiltered power is greater than it should be if the RF output frequency were actually in the pass band of the filter. A monostable pulse output thus requires the coincidence of two events: a pulse output from the RF detector 51 and a control signal from the recognition circuit 61.

Without the attenuator 55, the output of the amplifier 57 would always be negative since there is some attenuation by the filter 13 even when the RF output frequency is in the pass band. By cutting down the unfiltered input to the amplifier 57 by an appropriate factor or by adjusting the relative gain of the amplifier inputs, the cross-over of the amplifier output from a negative to a positive value can be made to coincide precisely with a desired cut-off frequency. That is, a particular cut-off point on the attenuation slope of the filter near the nominal cut-off frequency can be arbitrarily selected.

It will be understood that various changes in the details, materials, steps and arrangements of parts which have been herein described and illustrated in order to explain the nature of the invention, may be made by those skilled in the art within the principle and scope of the invention as expressed in the hereto appended claims.

What is claimed is:

1. A frequency stabilizing system for a semiconductor oscillator which exhibits bulk negative resistivity in the LSA mode and produces a pulsed RF output when a pulsed bias voltage substantially above the Gunn threshold is applied to an input of said semiconductor at a predetermined repetition rate, said system comprising:

a feedback circuit including discriminator means adapted to receive a portion of said RF output for producing an output indicative of the level of said RF output relative to a first predetermined frequency;

said discriminator means including a filter means connected to receive said portion of said RF output;

monostable means operatively connected to said filter means for producing a pulse output triggered in response to the output of said filter means;

said circuit further including a voltage adjusting means adapted to be connected to said semiconductor input with said applied bias voltage and receiving said discriminator means output for altering said applied bias voltage to compensate for changes in the frequency of said RF output; integrator means connected to receive said monostable pulse output for producing an integrated output;

said voltage adjusting means including diode means adapted to be connected to said semi-conductor input between said applied bias voltage and the output of said integrator means for clipping said applied bias voltage.

2. The system of claim 1, wherein said filter means is a high pass filter.

3. The system of claim 1, wherein said filter means is a low pass filter.

4. The system of claim 1, further comprising means for continuously discharging said integrator means.

5. The system of claim 1, wherein said integrator means has a time constant greater than the repetition period of said applied bias voltage.

6. The system of claim 4, wherein said discharging means provides a time constant greater than the repetition period of said applied bias voltage.

7. The system of claim 1, wherein the width of said monostable pulse output is a large fraction of the repetition period of said applied bias voltage.

8. The system of claim 1, wherein said diode is a Zener diode.

9. The system of claim 8, further comprising an amplifier connected between said integrator means and said Zener diode for amplifying the integrator output.

10. The system of claim 1, further comprising means connected to the input of said integrator to apply thereto a DC bias voltage approximately equal to one-half of the time-averaged voltage which would be applied to said integrator means if said monostable means were triggered during every repetition period of said applied bias voltage.

11. The system of claim 1, wherein said monostable means has at least two selectable output pulse widths, and a discriminator circuit connected to receive a portion of said RF output for producing a pulse width control output to said monostable means indicative of the level of said RF output relative to a second predetermined frequency differing from said first predetermined frequency such that the larger output pulse width of said monostable means will be selected when said RF output is further from said first predetermined frequency and the smaller of said monostable output pulse widths will be selected when said RF output is between said first and second predetermined frequencies.

12. The system of claim 1, further comprising means for varying the cut-off frequency of said filter means to select a desired frequency of said RF output.

13. The system of claim 1, wherein said discriminator means includes filter means connected to receive said portion of said RF output, and means responsive to the power level of the output of said filter means and the power level of said RF output for rendering said discriminator means output independent of changes in said power level of said RF output.

14. The system of claim 13, wherein said discriminator means further includes first RF detector means for producing an output indicative of the output of said filter means, first integrator means connected to receive the output of said first detector means, second RF detector means adapted to receive a portion of said RF output for producing an output indicative of the level of said RF output, second integrator means connected to receive the output of said second detector means, differential means operatively connected to produce an output indicative of the difference between said first and second integrator outputs, monostable means operatively connected to said differential means for producing a pulse output in response to the output of said differential means, and third integrator means connected to receive said monostable pulse output; said voltage adjusting means including breakdown diode means adapted to be connected to said semiconductor input between said applied bias voltage and the output of said third integrator means for clipping said applied bias voltage.

15. The system of claim 14, wherein said monostable means is connected to receive said second detector output as a trigger signal for producing said pulse output in response to both said second detector output and said differential means output, said differential means being connected to said monostable means such that said trigger signal is blocked when said differential means output is at a predetermined level.

16. A frequency control system, comprising a voltage controlled oscillator producing a pulsed RF output, filter means connected to receive a portion of said RF output, first RF detector means connected to receive the output of said filter means, first integrator means connected to receive the output of said first detector means, second RF detector means connected to receive a portion of said RF output, second integrator means connected to receive the output of said second detector means, differential means connected to receive the outputs of said first and second integrator means for producing an output indicative of the difference between said first and second integrator means outputs, and voltage adjusting means operatively connected between the output of said differential means and the voltage control input to said oscillator for adjusting the voltage applied to said oscillator to compensate for changes in said RF output frequency.

17. The system of claim 16, wherein said voltage adjusting means includes monostable means for producing a pulsed output controlled in response to the level of the output of said differential means, an integrating circuit connected to receive said monostable pulse output, and control means operatively connected between said integrating circuit and said oscillator input for providing a variable voltage thereto in response to the output of said integrating circuit.

18. The system of claim 17, wherein said oscillator input is adapted to receive a pulsed control voltage and said control means includes diode means operatively connected between said oscillator input and said integrating circuit to apply a clipping voltage to said oscillator input dependent on the output of said integrating circuit.

19. The system of claim 17, wherein said monostable means is connected to receive said second detector output as a trigger signal, said differential means being connected to said monostable means such that said trigger signal is blocked when said differential means output is at a predetermined level.

20. A frequency stabilizing system for a semiconductor oscillator which exhibits bulk negative resistivity in the LSA mode and produces a pulsed RF output when a pulsed bias voltage substantially above the Gunn threshold is applied to an input of said semiconductor, comprising a feedback circuit including first discriminator means adapted to receive a portion of said RF output for producing a trigger output indicative of the level of said RF output relative to a first predetermined frequency, a voltage adjusting circuit responsive to said trigger output and adapted to be connected to said semi-conductor input for changing said bias voltage by one of two different increments, and second discriminator means adapted to receive a portion of said RF output for producing an increment selection output to said voltage adjusting means indicative of the level of said RF output relative to a second predetermined frequency such that the larger increment of said bias voltage is selected when said RF output is further from said first predetermined frequency and the smaller increment is selected when said RF output is between said first and second predetermined frequencies.

21. A feedback control system, comprising a controlled element producing an output whose level is dependent on the level of a control signal, discriminator means receiving at least a portion of said controlled element output for producing a trigger output indicative of the level of said element output relative to a predetermined level, monostable means for producing an output pulse of predetermined width in response to said trigger output, integrator means connected to receive said monostable pulse, means connected to the input of said integrator to apply thereto a constant DC bias voltage approximately equal in magnitude to one-half of the time-averaged signal level which would be applied to said integrator means if said monostable means were activated as often as possible by said trigger output, and adjusting means responsive to the output of said integrator means operatively connected to change the level of said control signal applied to said controlled element to compensate for changes in the output of said controlled element.

* * * * *